United States Patent [19]

Clark et al.

[11] Patent Number: 4,847,479
[45] Date of Patent: Jul. 11, 1989

[54] SYSTEM FOR CONTROLLING THE WAVELENGTH AND COLINEARITY OF MULTIPLEXED LASER BEAMS

[75] Inventors: George L. Clark, Manhattan Beach; Lee O. Heflinger, Torrance, both of Calif.

[73] Assignee: TRW Inc., Redondo Beach, Calif.

[21] Appl. No.: 202,358

[22] Filed: Jun. 6, 1988

[51] Int. Cl.⁴ .......................... G01J 1/20; B23K 9/00
[52] U.S. Cl. ................................ 250/201; 219/121.78
[58] Field of Search ............ 250/201 R, 201 AF, 205, 250/550; 372/35; 356/345, 346, 349, 400, 153; 219/121.78, 121.79, 121.80, 121.81, 121.83

[56] References Cited

U.S. PATENT DOCUMENTS

| | | | |
|---|---|---|---|
| 4,035,083 | 7/1977 | Woodriff et al. | 356/368 |
| 4,146,329 | 3/1979 | King et al. | 356/153 |
| 4,342,906 | 8/1982 | Hyatt | 250/205 |
| 4,626,649 | 12/1986 | Dupeyrat et al. | 219/121.78 |
| 4,703,166 | 10/1987 | Bruning | 250/201 R |

Primary Examiner—David C. Nelms
Assistant Examiner—William L. Oen
Attorney, Agent, or Firm—Noel F. Heal; Sol L. Goldstein

[57] ABSTRACT

Apparatus and a related method for control of the colinearity of multiple laser output beams in a wavelength-multiplexed optical communications system. Multiple lasers of different wavelengths formed into a single composite beam by means of a diffraction grating and other optical components are subject to loss in colinearity due to wavelength drift and mechanical alignment drift. The apparatus of one disclosed embodiment of the invention includes an alignment detector for the output beam and a set of tracer modulation detectors responsive to tracer modulation signals impressed on the individual laser beams. Misalignment detected in any one or more of the laser beams contained in the output beam is corrected by temperature control of the appropriate lasers. In another disclosed embodiment of the invention, misalignment is detected by partially reflecting the output beams back through the diffraction grating and other optical components to the lasers, but at angles slightly divergent from the common plane of the lasers. Position detectors located adjacent to the lasers, but not in the same plane, receive the return beams and are coupled to temperature control devices to adjust the individual lasers' wavelength, and hence maintain the colinearity of the output beams.

8 Claims, 2 Drawing Sheets

SYSTEM FOR CONTROLLING THE WAVELENGTH AND COLINEARITY OF MULTIPLEXED LASER BEAMS

CROSS-REFERENCE TO RELATED APPLICATION

This application is related to Ser. No. 202,358, filed concurrently, entitled "Wavelength Multiplexing of Lasers," and assigned to the same assignee as the present application.

BACKGROUND OF THE INVENTION

This invention relates generally to optical communications systems and, more particularly, to optical communications systems employing wavelength-multiplexed optical beams from diode lasers. Semiconductor diode lasers are attractive for space communications systems because of their compactness and relatively low power consumption. However, for distances of up to 40,000 km or more, an average laser power of at least 300 mW is needed to obtain communication rates in the 1 Gbit/s (gigabit per second) range. Single diode lasers are not yet available at this power level. Even with the use of coherent laser arrays to increase power output, there is still a need for a new approach to increase the efficiency of the communication system.

A new approach to wavelength multiplexing of optical beams is disclosed and claimed in the cross-referenced patent application, which teaches how multiple laser beams may be combined to form a colinear set of output beams that can be demultiplexed using similar techniques. Although the cross-referenced application is not, in any sense, prior art to the present invention, a brief description of the wavelength multiplexing technique described in the application is needed by way of background to this invention.

In the cross-referenced application, multiple laser beams of different wavelengths are combined by means of roof prisms or a telescope, and directed onto a diffraction grating at angles of incidence selected to provide identical angles of diffraction for all of the beams. Thus, the multiple beams emerge from the diffraction grating in a coincident or colinear manner, and the combined beams have a total power approximating the sum of the individual beam powers.

One of the difficulties with such a system is that the angular relationships important to colinearity of the output beams are maintained only if the wavelengths are precisely regulated. The cross-referenced application suggested the use of a temperature control loop for this purpose. The diode voltage is sensed periodically and compared with a reference level to develop an error signal. The error signal is used to control the diode temperature, which is directly related to the diode wavelength. The principal drawback to this approach is that it does not take into account any mechanical misalignment of the components. Consequently, there can be loss of colinearity even if the temperatures and wavelengths of the diode lasers are perfectly maintained. The present invention overcomes this disadvantage and provides additional useful features, as will become apparent from the following summary.

SUMMARY OF THE INVENTION

The present invention resides in apparatus for control of the temperature of each laser based on its effect on the colinearity of the wavelength-multiplexed output beams. In accordance with the invention, any deviation from colinearity is sensed and used to develop a control signal to adjust the temperature and bring the system back into colinearity. Briefly, and in general terms, the apparatus of the invention comprises means for splitting off a portion of the combined output beams, means for identifying the separate beams, means for detecting any misalignment in each of the separate output beams, and generating control signals indicative of the degree of misalignment, and means responsive to the control signals, for controlling the temperature of the individual diode lasers and thereby bringing the separate output beams back into alignment.

In one illustrative embodiment of the invention, the means for splitting off a portion of the combined beams includes a partially reflective mirror acting as a beam splitter. The means for detecting any misalignment of the beams includes a focusing lens and a split detector. The lens focuses the sample output beam onto a sharp-edged prism, which reflects the beam in two opposite directions, to impinge on two identical detectors, the electrical outputs of which are connected to an amplifier that produces difference signals as its output.

A critical aspect of the invention is that the separate beams are rendered uniquely identifiable by applying a different tracer modulation signal to each laser beam. The difference signals emerging from the amplifier are then processed by a plurality of tracer modulation detectors, each of which is sensitive to only one of the tracer modulations. In this manner, the difference signals are split into a plurality of difference signals relating to the separate wavelength beams, and indicative of the degree of misalignment of each beam. The outputs of the tracer modulation detectors are coupled to respective temperature control devices associated with the diode lasers.

If one of the lasers drifts in wavelength, its sampled light beam from the diffraction grating output impinges preferentially on one of the two detectors, and a difference signal is generated in the amplifier. The difference signal is identified as being derived from a particular laser, and an appropriate correction signal is applied to the temperature control device for that laser.

Although each beam is inherently identifiable by its wavelength, the wavelengths may be too close together to permit the use of filtering to identify the separate beams. A more practical technique is to superimpose a low-frequency sine wave modulation on each laser beam. Different, and readily identifiable frequencies may be used for each laser beam, or the same frequency may be used at preselected times in a time-multiplexed manner.

In another embodiment of the invention, changes in wavelength are detected by means of a partially reflective flat mirror located in the output beam and angled to return a low-intensity beam slightly out of the dispersion plane. Each laser has a position detector positioned to receive its return beam, and coupled to a laser temperature control device to adjust the wavelength of the laser if the return beam drifts away from the center of the position detector.

It will be appreciated from the foregoing that the present invention represents a significant advance in the field of communications by optical beams. In particular, the invention provides precise control of the colinearity of wavelength-multiplexed beams, by sensing the misalignment of individual beams and making corresponding adjustments in laser temperature an wavelength to correct for both wavelength drift and for mechanical alignment drift. Other aspects and advantages of the invention will become apparent from the following more detailed description, taken in conjunction with the accompanying drawings.

DESCRIPTION OF THE PREFERRED EMBODIMENTS

Figure 1:
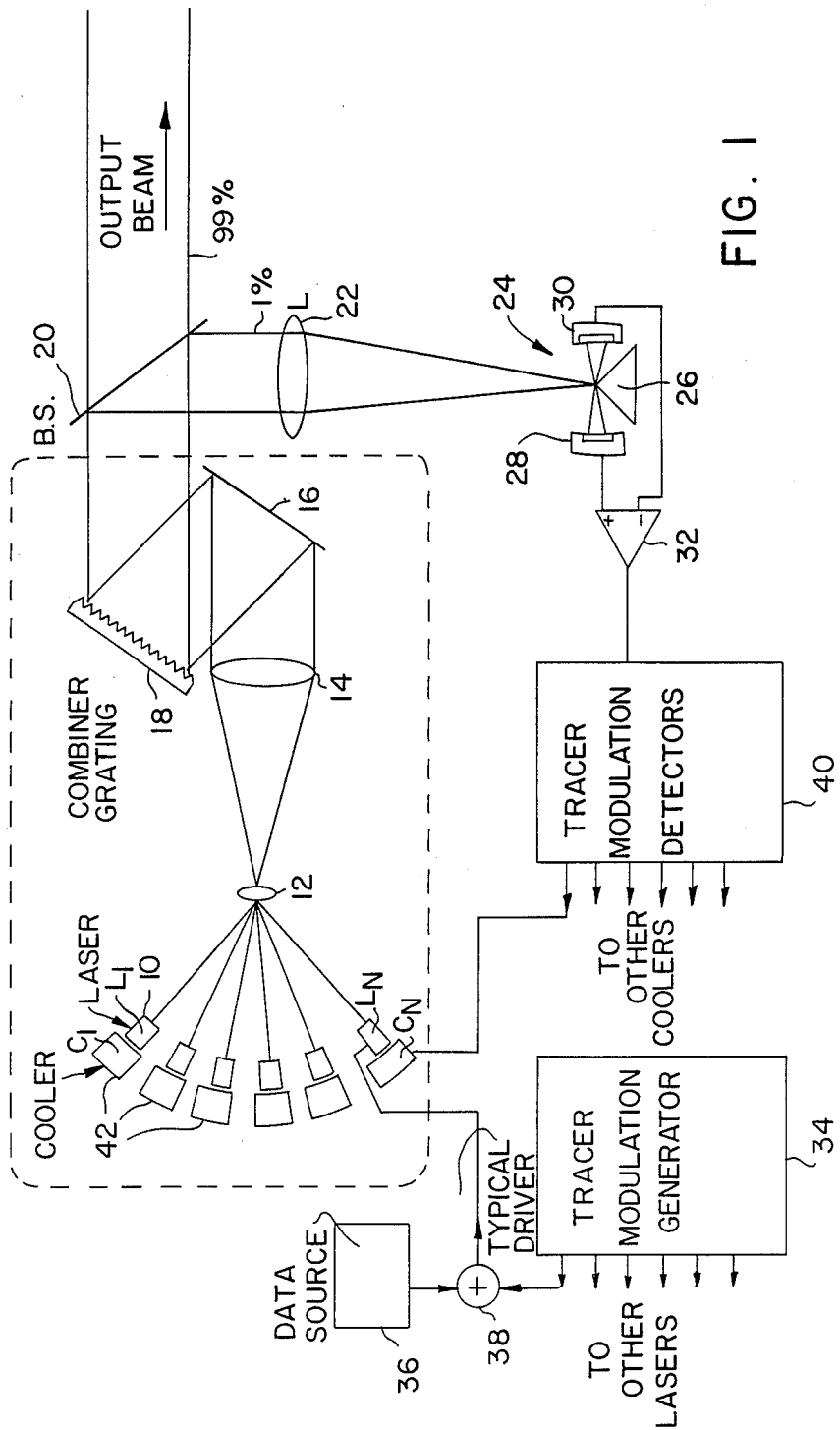
FIG. 1 is a schematic view of a wavelength and colinearity control system in accordance with the invention.

As shown in the drawings for purposes of illustration, the present invention is concerned with a technique for controlling colinearity and wavelength in a wavelength-multiplexed optical communications system. In wavelength multiplexing, multiple laser beams of different wavelengths are combined in such a manner as to provide colinear beams for transmission at a high total power level. However, diode lasers can drift in wavelength, and mechanical components can drift in alignment, with a resulting loss of colinearity of the beams.

In accordance with the invention, any misalignment of the multiple output beams is detected ad a misalignment error signal is generated for each of the multiple beams. The temperatures of the corresponding lasers are then controlled to correct the detected misalignment, regardless of whether the misalignment is due to wavelength drift or is due to drift in the alignment of the mechanical components.

FIG. 1 shows by way of example a wavelength multiplexing system in which multiple diode lasers, indicated by reference numeral 10, are arrayed about a circular arc and have their beams directed into a single telescope eyepiece lens 12. The angular directions of the separate laser beams are demagnified as the beams pass through the eyepiece lens 12 and then through a telescope objective lens 14. At this stage, the beams are practically collimated, but still have differences in angular direction. The beams are then reflected by a turning mirror 16 and impinge on a diffraction grating 18. The angular directions of the beams and the spacings of the components are selected to provide angles of incidence on the grating 18 such that the separate beam wavelengths are diffracted at identical angles of diffraction, thereby producing a composite output beam that includes perfectly colinear beams of the different wavelengths.

To detect misalignment of the output beams, a partially reflective beam splitting mirror 20 is positioned in the path of the output beam. Only a small percentage of the output beam intensity is reflected from the mirror 20 as a sample beam, and is focused by a lens 22 onto a detector assembly 24. The assembly 24 includes a metallized prism 26, onto which the sample beam is focused. If the sample beam is focused centrally onto the prism 26, two equal beams are reflected in opposite directions, and impinge on identical photodetectors 28 and 30. The outputs of the photodetectors 28 and 30 are connected to a difference amplifier 32, which generates a difference signal whenever at least one of the beams is out of perfect alignment.

In order to identify which laser is out of alignment, the system of the invention includes a tracer modulation generator 34, which generates a unique tracer signal for each of the lasers 10. The tracer signals may be, for example, low-frequency sine waves of a different frequency for each laser. Alternatively, a single frequency sine wave may be employed, but modulated onto the laser beams at different time intervals for each beam. In any event, the tracer modulation generator produces as many different outputs as there are diode lasers 10 and applies these signals to the respective lasers. Typically, each laser is also modulated by a data source, one of which is shown at 36. A modulating signal provided by the data source 36 is combined additively with the tracer modulation signal, as indicated at 38, and then applied to the individual laser 10.

The difference signals generated by the difference amplifier 32 are transmitted to a plurality of tracer modulation detectors 40, which identify the difference signals and associate them with individual lasers. If the tracer modulation is in the form of low-frequency sine waves, the detectors may include simple pass-band filters to separate the difference signals. The outputs of the detectors 40 are connected to corresponding temperature control units 42 associated with each of the lasers 10. The temperature control units may be conventional coolers used for diode laser temperature control.

If an individual diode laser 10 drifts in wavelength, this will result in a different angle of diffraction from the grating, and the resulting sample beam will impinge on one of the detectors 28 and 30 preferentially. A difference signal will therefore be generated at the output of the difference amplifier. This difference signal will be identified in the tracer modulation detectors 40 as being derived from the particular laser that was subject to wavelength drift, and a control signal will be transmitted to the appropriate temperature control device associated with that laser. If multiple lasers are subject to wavelength drift, the same corrective action takes place for each of the individual lasers, and there is a superposition of these effects in the detector assembly.

Importantly, the apparatus is responsive to drifts in the alignment of mechanical components as well as to drifts in the wavelengths of the lasers. Drifts in mechanical alignment are corrected by wavelength adjustment of the corresponding laser or lasers.

The alignment corrections referred to above relate to alignment in one plane only, since changes of wavelength operate through the diffraction grating to affect beam direction in only one plane. However, the system of the invention may be modified to compensate for mechanical misalignment in an orthogonal direction as well. This requires the use of a four-quadrant detector instead of a split detector, to detect misalignment in both orthogonal directions, and the addition of mechanical actuators to displace the laser beams in a direction perpendicular to the plane in which the corrections described above are made, i.e. in a direction parallel to the lines on the diffraction grating.

Figure 2:
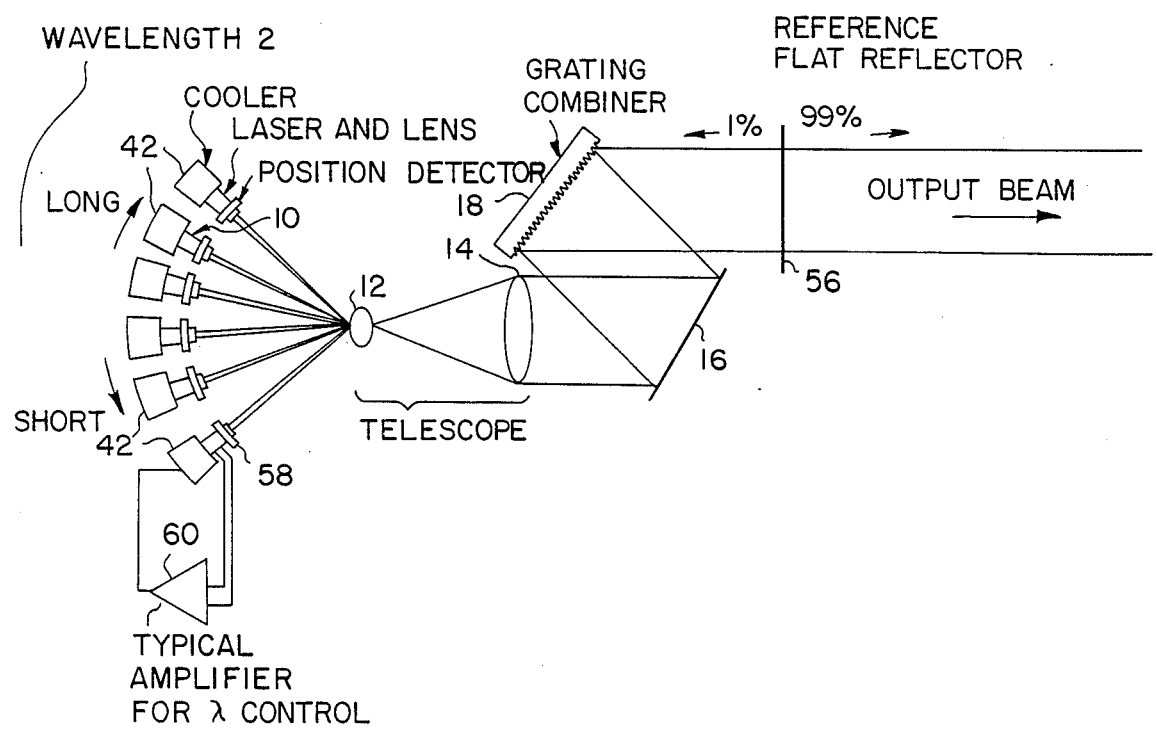
FIG. 2 is a schematic view of another embodiment of the wavelength and colinearity control system of the invention, with wavelength control of individual lasers by means of a reflected beam that is slightly divergent from the wavelength plane of the system.
Figure 3:
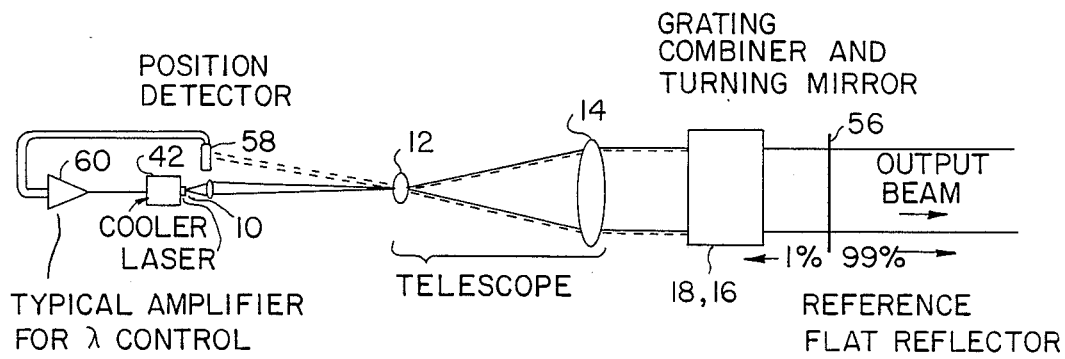
FIG. 3 is a schematic view of system of FIG. 2, in a plane orthogonal to the wavelength plane.

FIGS. 2 and 3 illustrate another preferred embodiment of the invention. The arrangement in the wavelength plane is similar to that of FIG. 1, and includes the multiple lasers 10 with temperature control coolers 42, the telescope eyepiece lens 12 and objective lens 14, the turning mirror 16 and the diffraction grating 18. Disposed in the path of the output beam from the grating 18 is a partially reflective flat mirror 56, which reflects only a small proportion of the light impinging on it, for example one percent. The flat mirror is perpendicular to the output beam as viewed in the dispersion plane, i.e. as viewed in FIG. 2, but is slightly angled to the perpendicular when viewed in an orthogonal plane, as shown in FIG. 3. Therefore, the return path from the flat mirror 56 follows a path that is slightly divergent from the original path, as indicated by the broken lines in FIG. 3.

Each laser 10 has an associated position detector 58 located adjacent to the corresponding laser but out of the wavelength plane, as indicated in FIG. 3. The position detector 58 receives the return beam from the flat mirror 56, and is coupled to an amplifier 60, the output of which is connected to the laser cooler 42. If the wavelength of the laser drifts, the return beam will tend to shift on the position detector, and an appropriate temperature adjustment will be made by the laser cooler 42, to move the wavelength back toward its desired value, and hence maintain the colinearity of the output beams.

It will be appreciated that the present invention represents a significant advance in the field of optical communications systems. In particular, the invention provides a simple technique for the correction of colinearity errors caused by wavelength drift in the lasers, or by mechanical alignment errors. It will also be appreciated that, although an embodiment of the invention has been described in detail for purposes of illustration, various modifications may be made without departing from the spirit and scope of the invention. For example, the multiplexing apparatus shown within the broken lines in FIG. 1 need not be the particular type illustrated. Either of the other embodiments disclosed in the cross-referenced application would be equally suitable for use in conjunction with this invention. Accordingly, the invention is not to be limited except as by the appended claims.

We claim:

1. Apparatus for maintaining colinearity of multiple output beams in a wavelength multiplexer of diode lasers of different wavelengths, the apparatus comprising:

means for splitting off a sample beam from the combined output beams;
means for identifying the separate beams;
means for detecting any misalignment in each of the separate output beams, and generating control signals indicative of the degree of misalignment; and
means responsive to the control signals, for controlling the temperature of the individual diode lasers and thereby bringing the separate output beams back into alignment.

2. Apparatus as defined in claim 1, wherein:
the means for splitting off the sample beam includes a partially reflective mirror positioned in the path of the output beams.

3. Apparatus as defined in claim 2, wherein the means for detecting any misalignment includes:
focusing means;
split detector means having a reflective prism onto which the sample beam is focused, to produce two identical but oppositely directed beams if there is perfect alignment, and a pair of photo-detectors positioned to receive the oppositely directed beams; and a difference amplifier coupled to receive the outputs of the photodetectors, for producing difference signals indicative of the misalignment of the beams.

4. Apparatus as defined in claim 3, wherein the means for identifying separate beams includes:
a tracer modulation generator for generating unique tracer signals for application to the separate laser beams;
means for modulating the laser beams with the tracer signals; and
means for detecting the separate tracer signals in the output signals from the difference amplifier, and thereby providing control signals for each of the means for controlling the temperature of the lasers.

5. Apparatus as defined in claim 4, wherein:
the means for controlling the temperature include coolers associated with respective ones of the lasers.

6. Apparatus for maintaining colinearity of multiple output beams in a wavelength multiplexer of diode lasers of different wavelengths, the apparatus comprising:
a plurality of laser diodes operating at different wavelengths;
an optical wavelength multiplexer operative to produce colinear output beams from multiple input beams of different wavelengths impinging at different angles but lying in common wavelength plane;
focusing means for directing multiple laser beams from the diodes onto the optical wavelength multiplexer to produce colinear output beams;
a partially reflective mirror positioned in the path of the output beams and oriented to provide return beams reflected back through the multiplexer and the focusing means at an angle slightly divergent from the wavelength plane;
a plurality of position detectors located one at each laser diode to receive the respective return beams and thereby detect any drift in wavelength; and
means responsive to the position detectors, for controlling the temperatures of the individual diode lasers and maintaining the output beams in alignment.

7. A method for compensating for wavelength and colinearity errors in a wavelength-multiplexed communications system, the method comprising the steps of:
modulating each a plurality of different-wavelength laser beams with a unique tracer signal;
splitting off a sample beam from a combined output beam that includes multiple beams of different wavelengths;
detecting any misalignment in the sample beam;
generating difference signals indicative of any detected misalignment;
identifying tracer signals in the difference signals and thereby associating the difference signals with one or more lasers; and
applying the difference signals to respective temperature control devices to adjust the temperature and hence the wavelength of the lasers to bring the output beams into colinearity.

8. A method for compensating for wavelength and colinearity errors in a wavelength-multiplexed communications system, the method comprising the steps of:
directing multiple laser beams of different wavelengths from coplanar laser diodes into an optical wavelength multiplexer capable of producing generally colinear output beams from appropriately directed input beams of different wavelengths lying in the same plane;

reflecting a portion of the output beams back through the multiplexer as return beams oriented at angles slightly divergent from the plane of the input beams;

detecting the return beams with detectors located adjacent to but not coplanar with the laser diodes; and controlling the temperatures of the individual laser diodes in response to the detected return beams, to adjust the wavelengths of the diodes and hence maintain colinearity of the output beams.

* * * * *